INVENTOR
H. CHRISTENSEN
BY
[signature]
ATTORNEY

Patented Dec. 15, 1953

2,662,997

UNITED STATES PATENT OFFICE 2,662,997

MOUNTING FOR SEMICONDUCTORS

Howard Christensen, Springfield, N. J., assignor to Bell Telephone Laboratories, Incorporated, New York, N. Y., a corporation of New York Application November 23, 1951, Serial No. 257,890

10 Claims. (Cl. 317—239)

Figure 1:
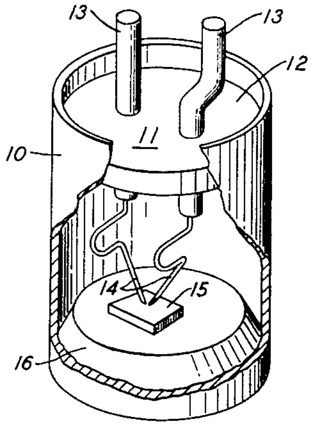

This invention relates to electrical translators employing semiconductor bodies and more particularly to mountings for such bodies in translators.

An object of this invention is to facilitate the manufacture of electrical translators. Another object is to improve the electrical characteristics of such translators. Other objects include reducing the expense of mounting semiconductor bodies on conductive bases and eliminating thermal strain in semiconductor bodies in translating devices.

Heretofore it has been common practice to mount semiconductor bodies in a conductive cup by freezing of soft metal around them. More recently, semiconductor bodies have been secured to conductive bases by soldering techniques. As the art of producing semiconductors, particularly of the elemental form such as germanium or silicon, has been refined, it has been found that these methods of mounting introduce undesirable physical and electrical characteristics which previously were not apparent due to the overshadowing poor quality of the material heretofore available.

It has been discovered that the physical junctions between semiconductor bodies and the bases on which they are mounted and the processes employed in their manufacture were a principal source of high level noise in translators incorporating the semiconductors. Electron microscope studies of these physical junctions revealed that cracks and fissures which were generally too small to be seen in a light microscope were present in the semiconductor. These imperfections, which were not present in the bodies prior to their being secured to their conductive mountings, disrupted the crystalline structure of the semiconductor body to alter its electrical conductivity even to the extent of forming considerable unwanted electrical barriers therein.

It is believed that the imperfections created in the semiconductor during the mounting process were the result of mechanical strains set up therein by the thermal cycling necessary in forming the ohmic bond to the conductive base. Brass or other copper base alloys as commonly employed as the conductive bases for semiconductor bodies have a thermal expansion about twice that of germanium and about four times that of silicon. Therefore, during the soldering operation some strain is introduced into the wafer, usually in the cooling cycle. The base contracts to a substantially greater extent than the semiconductor in cooling from the freezing temperature of the bonding material to ambient or operating temperature so that the wafer is placed under substantial compression at room temperature. This strain is present to a particularly high degree in those mountings in which no plating of the semiconductor body is employed, for example where it is desirable for electrical reasons such as to avoid the emission of unwanted charge carriers into the semiconductor from the plated coatings. When the body is not coated, wetting of the semiconductor by the solder can be accomplished only at relatively high temperatures of the order of 200 to 300° C., and in cooling through the range from these temperatures to ambient, stresses are created in the body due to the expansion differential between it and the mounting.

A feature of this invention resides in an improved mounting including a conductive base of a material having a thermal coefficient of expansion which closely approaches that of the semiconductor throughout the range of temperatures to which the unit will be subjected in manufacture and use. Another feature resides in utilizing ferromagnetic materials which have low thermal expansion coefficients below their Curie point, as the base material on which semiconductor bodies are mounted. A particularly advantageous composition of base material for a germanium body includes an alloy composed of the following proportions by weight; 56 per cent iron, 43.57 per cent nickel, and 0.53 per cent manganese. This material has a coefficient of expansion at 20° C. of $6.3\times10^{-6}$ per centigrade degree as compared with $6.2\times10^{-6}$ per centigrade degree for germanium. The coefficient of expansion for silicon at 20° C. is $2.9\times10^{-6}$ per centigrade degree. An alloy base of a nickel-iron alloy containing about 38 per cent nickel and 0.4 per cent manganese by weight matches this over a substantial temperature range and thereby avoids thermal strains.

Figure 2:
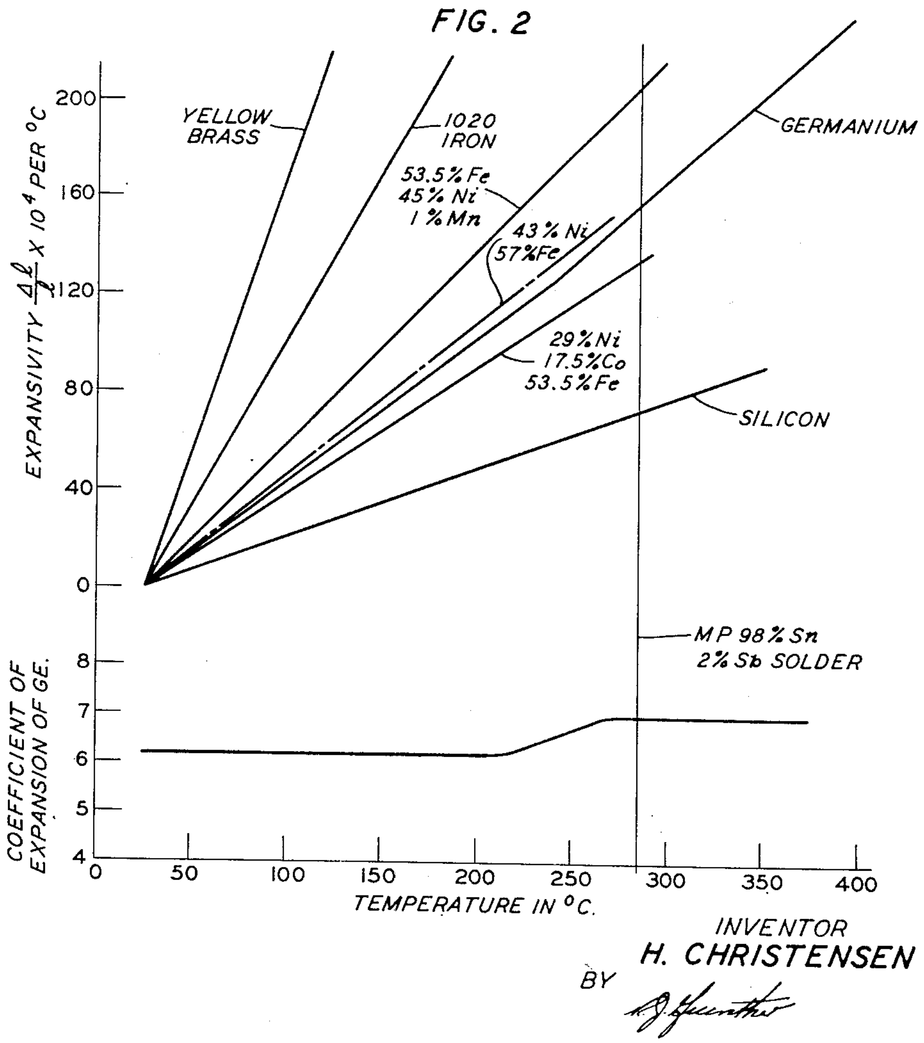

The above and other objects and features of this invention will be more fully understood from the following detailed description when read in conjunction with the accompanying drawings in which:

Fig. 1 is a perspective of a translating device utilizing a semiconductor mounting illustrative of this invention with a portion of the housing broken away to reveal its internal construction, and Fig. 2 is a plot of expansion against temperature for germanium, silicon, and various materials on which it may be mounted.

Referring now to the drawing, a triode translator of the type now known as a transistor is shown in Fig. 1. This transistor comprises a cartridge housing 10, a point contact assembly 11 including an insulating plug 12 fitted into the housing, and a pair of pins 13 molded in the plug and supporting a pair of point contacts 14 in critically spaced relationship. The semiconductor wafer 15 which is engaged by the contacts 14 is mounted with an ohmic connection to a conductive base 16 which is in the form of a plug fitting within the conductive housing 10. The base 16, which has heretofore usually been of brass, and therefore has made a very poor match from the standpoint of thermal expansion with the germanium, is in accordance with this invention made of a material whose thermal coefficient of expansion closely approaches that of germanium throughout the temperature range to which the combination will be subjected during its manufacture and use. The maximum temperature to which a near expansion match need be maintained is the freezing temperature of the bonding medium.

As may be seen from Fig. 2 some ferromagnetic alloys of nickel and iron are particularly well-suited for the conductive base 16 since their thermal coefficients closely approximate that of germanium. It will also be seen from this figure that brass or iron base materials which have been used previously provide very poor thermal expansion matches with germanium. This results in the mechanical strains described above since it has been necessary to raise the temperature of the wafer mounting to relatively high temperatures while soldering them together.

When no intermediate plating which is readily wetted by solders having low melting temperatures is applied to the semiconductor body, it has been the usual practice to utilize solders which would wet germanium at from about 200 to about 300° C. A satisfactory bond is accomplished with such a solder composed of 98 per cent tin and 2 per cent antimony. However, when this solder is employed between a brass base and a germanium wafer with zinc ammonium chloride as a flux, the wafer and base must be heated to above 285° C., the melting temperature of the solder, and a substantial strain is imposed on the wafer in cooling it from this temperature to room temperature, about 30° C., since a contraction differential of about $13.8\times10^{-6}$ per centigrade degree over a range of 255° C. is present to create a compressive force. It is desirable from the standpoint of economy to eliminate the step of plating an easily wetted layer on the geramnium, for example electroplated copper; further, the absence of such a coating is an advantage in that it provides a base through which whole emission into the N-type germanium is substantially reduced. However, in prior germanium devices without this coating have been found to be noisy and unstable due to the thermal strains set up in cooling from the high bonding temperatures. The use of a conductive base having a thermal coefficient of expansion close to that of the semiconductor, where a perfect match is no available a material having a slightly higher coefficient than the semiconductor can be advantageously employed, substantially eliminates the noise in the junction and the instability of the unit even in the absence of special coatings and with the use of high bonding temperatures. Substantially strain-free junctions are obtained between germanium and base materials having expansion coefficients in the temperature range under consideration of from about $5\times10^{-6}$ to $8\times10^{-6}$ per centigrade degree and between silicon and base material having coefficients of expansion in the temperature range under consideration of from $2\times10^{-6}$ to $4\times10^{-6}$ per centigrade degree. Examples of suitable base materials for germanium include the nickel-iron-cobalt alloy, Kovar, containing the following proportions by weight: 29 per cent nickel, 17.5 per cent cobalt, 53.5 per cent iron; or the nickel-iron alloy containing of the order of 57 per cent iron by weight and 43 per cent nickel by weight or one of the permalloys such as that having a coefficient of expansion of $8.0\times10^{-6}$ per centigrade degree and composed of 53.55 per cent iron by weight, 44.71 per cent nickel by weight, and 1.05 per cent manganese by weight. The function of the manganese in these mixtures is to improve the mechanical working properties; otherwise they crack easily. Cobalt further aids in matching the expansion coefficient of the semiconductors and is particuarly advantageous in raising the Curie temperature of the alloys.

Silicon is also detrimentally effected by the strains set up in it in the region of its junction with a conductive base member. Rhodium plating has usually been employed on that surface of a silicon body which is soldered to a metallic base. However, even with such a plating the solders employed in bonding the base to the body have freezing temperatures sufficiently high so that they are bonded together at a temperature substantially above ambient. Hence, there is a considerable temperature range in which the differential between the coefficient of thermal expansion for the usual base materials and that for silicon can operate to impose strains. Silicon's coefficient of expansion of $2.9\times10^{-6}$ per centigrade degree is admirably well met up to their Curie temperatures, about 200° C., by nickel-iron alloys containing about 38 to 42 per cent nickel by weight which may contain traces of other materials such as manganese or chromium.

The ferromagnetic alloys suggest themselves since they are of a nature such that their temperature coefficients of expansion up to their Curie temperature is in the range of those of germanium and silicon and can be conveniently adjusted by changes in composition. In most metals the energy resulting from a rise in their temperature is stored in the form of atomic vibrations which occur in the quasi equilibrium of the metallic crystal and these vibrations cause the metal to expand. In the ferromagnetic material this expansion is offset by the lessening of magnetic repulsion force between adjacent atoms that occurs when the magnetic moment vector associated with each atom tends to change from being parallel to neighbor atoms at low temperatures to that of becoming random in orientation at the higher temperatures up to the Curie temperature. Above the Curie temperature, the magnitude of the atomic vibrations in ferromagnetic material increases and its thermal coefficient of expansion is of the order of that for other metals; therefore another criterion in selecting a base material is that its Curie temperature be above the freezing temperature of the bonding medium.

It is to be understood that the above-described arrangements are illustrative of the application of the principles of the invention. Numerous other arrangements may be devised by those skilled in the art without departing from the spirit and scope of the invention.

What is claimed is:

1. In a combination, a semiconductor body of material selected from the group including germanium and silicon, and a metallic base member to which said body is bonded, the material of said base member having a thermal coefficient of expansion of about the same value as that of the body over the temperature range to which the combination is subjected in manufacture and use.

2. An element for semiconductive units including a body of material selected from the group including germanium and silicon, a metallic base having a thermal coefficient of expansion of about the same value as that of the material of the body, and a solder bond between said body and said base.

3. An element for semiconductor units including a germanium body, a metallic base having a thermal coefficient of expansion of from $5\times10^{-6}$ to $8\times10^{-6}$ per centigrade degree over the temperature range to which said element is subjected in manufacture and use, and a bond between said body and said base.

4. An element for semiconductive units including a silicon body, a metallic base having a thermal coefficient of expansion of from $2\times10^{-6}$ to $4\times10^{-6}$ per centigrade degree over the temperature range to which said element is subjected in manufacture and use, and a bond between said body and said base.

5. An element for semiconductor units including a semiconductor body of material selected from the group consisting of germanium and silicon, a metallic base composed of a nickel-iron alloy having a thermal coefficient of expansion of about the same value as that of the elemental semiconductor, and a bond between said body and said base.

6. A semiconductor unit comprising a germanium body, a metallic base for said germanium body comprising about 43 per cent nickel and about 57 per cent iron, and a bond between said body and said base.

7. A semiconductor unit comprising a germanium body, a metallic base for said germanium body comprising about 29 per cent nickel, about 17.5 per cent cobalt and the remainder iron, and a bond between said body and said base.

8. A semiconductor unit comprising a germanium body, a metallic base for said germanium body comprising about 53.55 per cent iron, about 44.71 per cent nickel, and about 1.05 per cent manganese, and a bond between said body and said base.

9. A semiconductor unit comprising a silicon body, a metallic base for said silicon body comprising about 38 per cent nickel and about 62 per cent iron, and a bond between said body and said base.

10. A semiconductor unit comprising a silicon body, a metallic base for said silicon body comprising about 38 per cent nickel, about 0.4 per cent manganese and the remainder iron, and a bond between said body and said base.

HOWARD CHRISTENSEN.

References Cited in the file of this patent

UNITED STATES PATENTS

| Number | Name | Date |
|---|---|---|
| 1,905,703 | Harries | Apr. 25, 1933 |
| 2,243,573 | Murphy | May 27, 1941 |
| 2,328,488 | Peters | Aug. 31, 1943 |
| 2,330,594 | Kipphan et al. | Sept. 28, 1943 |
| 2,549,888 | Burkholder | Apr. 24, 1951 |

FOREIGN PATENTS

| Number | Country | Date |
|---|---|---|
| 291,026 | Great Britain | June 13, 1929 |
| 590,284 | Germany | Dec. 28, 1933 |